(12) United States Patent
Ohashi

(10) Patent No.: US 8,708,463 B2
(45) Date of Patent: Apr. 29, 2014

(54) PIEZOELECTRIC DEVICE, PIEZOELECTRIC ACTUATOR, LIQUID EJECTING HEAD, AND LIQUID EJECTING APPARATUS

(75) Inventor: Koji Ohashi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 302 days.

(21) Appl. No.: 12/943,177

(22) Filed: Nov. 10, 2010

(65) Prior Publication Data

US 2011/0109701 A1    May 12, 2011

(30) Foreign Application Priority Data

Nov. 10, 2009  (JP) .................................. 2009-257030

(51) Int. Cl.
*B41J 2/045*    (2006.01)

(52) U.S. Cl.
USPC ........................................................... 347/68

(58) Field of Classification Search
None
See application file for complete search history.

(56) References Cited

U.S. PATENT DOCUMENTS

| | | | |
|---|---|---|---|
| 7,273,268 B2* | 9/2007 | Yagi et al. ...................... | 347/72 |
| 7,522,018 B2 | 4/2009 | Milsom et al. | |
| 7,622,850 B2 | 11/2009 | Iwashita et al. | |
| 7,812,425 B2 | 10/2010 | Yamakawa et al. | |
| 2002/0003247 A1* | 1/2002 | Yokoyama et al. ........... | 257/296 |
| 2005/0105038 A1* | 5/2005 | Kondo et al. .................. | 349/156 |
| 2007/0045689 A1 | 3/2007 | Lim et al. | |
| 2009/0021119 A1 | 1/2009 | Yasumi et al. | |

FOREIGN PATENT DOCUMENTS

| | | |
|---|---|---|
| CN | 1723618 | 1/2006 |
| CN | 1805164 | 7/2006 |
| CN | 1930448 | 3/2007 |
| JP | 2000-244030 | 9/2000 |
| JP | 2002-026284 | 1/2002 |
| JP | 2002-234709 | 8/2002 |
| JP | 2007-043166 | 2/2007 |
| JP | 2009-105388 | 5/2009 |

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric device includes a first electrode and a facing second electrode, with a piezoelectric layer therebetween. The first electrode includes a first conductive layer, a first intermediate layer that contacts the first conductive layer, a second intermediate layer that contacts the first intermediate layer, and a second conductive layer that contacts the second intermediate layer and the piezoelectric layer. The first conductive layer contains a metal and an alloy. The metal is Ti, Zr, Hf, V, Nb, Ta, Cr, Mo, W, Mn, Fe, Co, Ni, Cu, Ag, or Au, and the alloy contains at least one of the foregoing metals. The first intermediate layer contains a nitrogen compound. The second intermediate layer contains a metal and an alloy. The metal is Ti, Zr, W, Ta, or Al, and the alloy contains at least two of the foregoing metals. The second conductive layer contains a conductive oxide.

11 Claims, 6 Drawing Sheets

PIEZOELECTRIC DEVICE, PIEZOELECTRIC ACTUATOR, LIQUID EJECTING HEAD, AND LIQUID EJECTING APPARATUS

The entire disclosure of Japanese Patent Application No. 2009-257030, filed Nov. 10, 2009 is expressly incorporated by reference herein.

BACKGROUND

1. Technical Field

The present invention relates to a piezoelectric device, a piezoelectric actuator, a liquid ejecting head, and a liquid ejecting apparatus.

2. Related Art

For example, a piezoelectric device in which a crystallized ceramic material is disposed between two electrodes is utilized as a piezoelectric actuator. An example of the piezoelectric actuator includes a type in which a movable member such as a vibrating plate is actuated in a bending vibration mode. Such a piezoelectric actuator is utilized in an ink jet recording head, in which a pressure generating chamber that is in communication with a nozzle hole that ejects an ink liquid is partially formed with a vibrating plate and in which the vibrating plate is actuated by a piezoelectric device to pressurize ink that has been introduced into the pressure generating chamber with the result that the ink liquid is ejected from the nozzle hole.

On the other hand, the configuration in which the crystallized ceramic material is disposed between the two electrodes is also utilized in a ferroelectric memory or the like other than the above piezoelectric device. For example, in JP-A-2007-043166, a ferroelectric structure is proposed, in which a ferroelectric layer is disposed between a lower electrode and an upper electrode.

For example, in order to preclude a change in shape and a chemical change due to heat applied during sintering of a piezoelectric layer formed with a ceramic, platinum group metals such as Ru, Rh, Pd, Os, Ir, and Pt are commonly used as materials of typical piezoelectric devices.

Such metals have advantages such as relatively high electrical conductivity and chemical stability but have a disadvantage such as relatively high rigidity, resulting in such metals being fragile. Accordingly, in existing piezoelectric devices, because the electrode of the piezoelectric device contains such platinum group metals, the rigidity of the electrode may be increased to restrict the change in the shape of the piezoelectric device, or the friability of the electrode may cause destruction of the electrode and piezoelectric layer. Furthermore, such metals are expensive nowadays, resulting in high production costs of piezoelectric devices.

SUMMARY

An advantage of some aspects of the invention is that it provides a piezoelectric device including an electrode having excellent electrical conductivity and durability.

Some aspects of the invention are capable of being brought into practice in embodiments which will be described hereinafter.

According to a first aspect of the invention, there is provided a piezoelectric device including: a first electrode; a second electrode provided so as to face the first electrode; and a piezoelectric layer disposed between the first electrode and the second electrode. The first electrode has a first conductive layer, a first intermediate layer provided so as to be in contact with the first conductive layer, a second intermediate layer provided so as to be in contact with the first intermediate layer, and a second conductive layer provided so as to be in contact with the second intermediate layer and the piezoelectric layer. The first conductive layer contains one metal selected from the group consisting of Ti, Zr, Hf, V, Nb, Ta, Cr, Mo, W, Mn, Fe, Co, Ni, Cu, Ag, and Au or contains an alloy of at least one metal selected from such a group. The first intermediate layer contains a nitrogen compound. The second intermediate layer contains one metal selected from the group consisting of Ti, Zr, W, Ta, and Al or contains an alloy of at least two metals selected from such a group. The second conductive layer contains a conductive oxide.

In the piezoelectric device having the above advantage, a material of the first conductive layer of the first electrode is one metal selected from the group consisting of Ti, Zr, Hf, V, Nb, Ta, Cr, Mo, W, Mn, Fe, Co, Ni, Cu, Ag, and Au or is the alloy containing at least one metal selected from such a group. Accordingly, in the piezoelectric device having such a configuration, the first conductive layer of the first electrode has at least any one of high electrical conductivity and high durability. Consequently, in the first electrode, both the electrical conductivity and durability are satisfied. Namely, in the piezoelectric device having the above advantage, at least both the first conductive layer and the second conductive layer have electrical conductivity, and therefore the first electrode has excellent electrical conductivity as a whole. In addition, at least the first conductive layer is produced with a material that is more flexible than the materials of platinum group metals, and therefore the first electrode has excellent flexibility as a whole.

Furthermore, in the piezoelectric device having the above advantage, the first intermediate layer containing the nitrogen compound is disposed between the first conductive layer and the second conductive layer. Accordingly, for example, the first intermediate layer suppresses the diffusion of moisture and oxygen from the piezoelectric layer or the like to the first conductive layer during the sintering of the piezoelectric layer in manufacturing of the piezoelectric device. Therefore, the material of the first conductive layer is processed in good conditions. Consequently, the piezoelectric device having the above advantage has excellent conductivity and durability.

Furthermore, in the piezoelectric device having the above advantage, the second intermediate layer enhances at least adherence between the first intermediate layer and the second conductive layer. Accordingly, the piezoelectric device having the above advantage achieves increased durability.

Furthermore, the piezoelectric device having such an advantageous configuration includes the second conductive layer containing a conductive oxide, and the second conductive layer is in contact with the piezoelectric layer. Accordingly, in the piezoelectric device having such an advantageous configuration, the piezoelectric layer has excellent crystalline properties, thereby exhibiting excellent piezoelectric properties such as a deformation amount and durability.

In the piezoelectric device having such an advantageous configuration, noble metals (Ru, Rh, Pd, Os, Ir, and Pt) content in the first electrode is significantly smaller relative to the case where the first electrode is mainly produced with noble metals. Accordingly, as compared with the case where the first electrode is mainly produced with the noble metals, at least the flexibility and durability of the first electrode are increased, and costs of a material of the piezoelectric device are reduced.

It is preferable that the first conductive layer contains one metal selected from the group consisting of Ti, Zr, Hf, V, Nb, Ta, Cr, Mo, W, Mn, Fe, Co, Ni, Cu, Ag, and Au or contains an alloy containing at least two metals selected from such a group.

In the piezoelectric device having such an advantage, a material of the first conductive layer of the first electrode is one metal selected from the group consisting of Ti, Zr, Hf, V, Nb, Ta, Cr, Mo, W, Mn, Fe, Co, Ni, Cu, Ag, and Au or is an alloy containing at least two metals selected from such group. Accordingly, in the piezoelectric device having such an advantage, the first conductive layer of the first electrode does not contain the noble metals (Ru, Rh, Pd, Os, Ir, and Pt). Consequently, in addition to the advantageous effects according to the first aspect, another advantageous effect is provided, in which the first conductive layer has at least any one of high conductivity and high durability.

It is preferable that the first intermediate layer contains a nitrogen compound containing at least one metal selected from the group consisting of Ti, Al, Ta, W, and Si.

In the piezoelectric device having such a configuration, the first intermediate layer effectively suppresses the diffusion of moisture and oxygen from a side of the piezoelectric layer to the first conductive layer. Accordingly, the diffusion of the moisture and oxygen from the side of the piezoelectric layer to the first conductive layer is sufficiently suppressed, for example, during the sintering of the piezoelectric layer in the manufacturing of the piezoelectric device. Consequently, in addition to the above advantageous effects, the piezoelectric device having such a configuration has another advantageous effect in which a material of the first conductive layer is processed in good conditions.

It is preferable that the second conductive layer contains a conductive oxide containing at least one element selected from the group consisting of La, Sr, Ca, In, Ni, Ru, and Sn.

In the piezoelectric device having such a configuration, a material of the second conductive layer of the first electrode is an oxide containing at least one element selected from the group consisting of La, Sr, Ca, In, Ni, Ru, and Sn. Accordingly, in addition to the above advantageous effects, another advantageous effect is provided, in which the piezoelectric device having such a configuration has at least any one of both an improvement in electrical conductivity of the second conductive layer and an improvement in crystalline properties of the piezoelectric layer.

According to a second aspect of the invention, there is provided a piezoelectric actuator including: the piezoelectric device having any one of the above advantages; a third intermediate layer provided so as to be in contact with the first conductive layer; and a substrate provided so as to be in contact with the third intermediate layer. The substrate deforms in response to the deformation of the piezoelectric device.

The piezoelectric actuator having such a configuration includes the piezoelectric device having any one of the above advantages, thereby at least exhibiting excellent durability.

According to a third aspect of the invention, there is provided a liquid ejecting head including the piezoelectric actuator having the advantage of the second aspect.

The liquid ejecting head having such a configuration includes the piezoelectric actuator having the advantage of the second aspect, so that the first electrode is provided with electrical conductivity and flexibility, thereby exhibiting at least excellent durability.

According to a fourth aspect of the invention, there is provided a liquid ejecting apparatus including the liquid ejecting head having the advantage of the third aspect.

The liquid ejecting apparatus having such a configuration includes the liquid ejecting head having the advantage of the third aspect, so that the first electrode is provided with electrical conductivity and flexibility, thereby exhibiting at least excellent durability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention will be described with reference to the accompanying drawings. The embodiments to be described are examples of the invention. The embodiments of the invention are not limited to the embodiments described below and include various modifications without departing from the scope of the invention.

1. Piezoelectric Device

Figure 1:
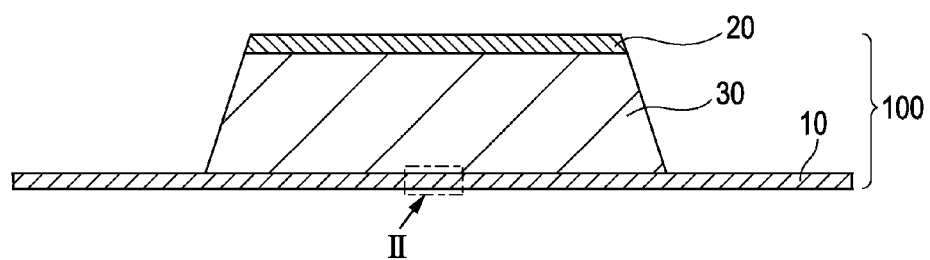
FIG. 1 is a cross-sectional view schematically illustrating a piezoelectric device according to an embodiment.
Figure 2:
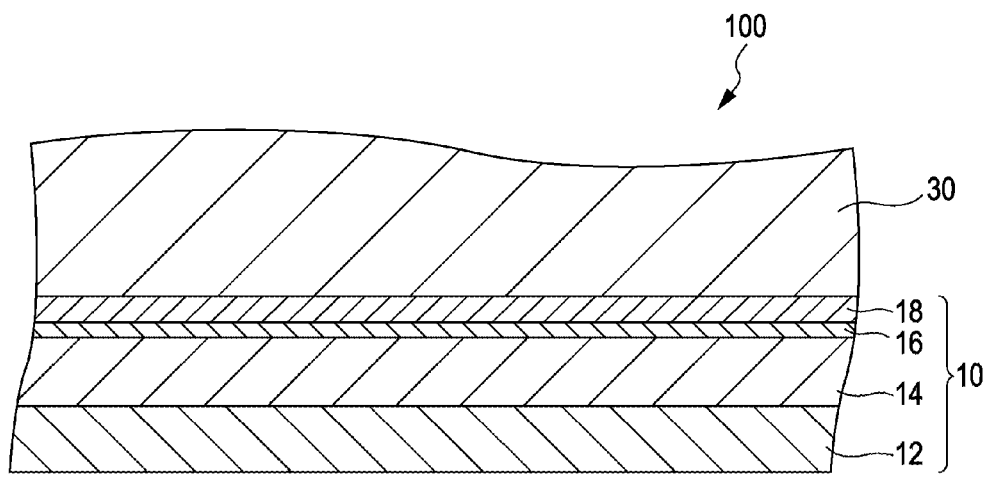
FIG. 2 is a cross-sectional view schematically illustrating part of the piezoelectric device according to the embodiment in an enlarged manner.

FIG. 1 is a cross-sectional view schematically illustrating a piezoelectric device 100 according to an embodiment of the invention. FIG. 2 is a cross-sectional view schematically illustrating part of the piezoelectric device 100 according to the embodiment in an enlarged manner.

The piezoelectric device 100 according to the embodiment includes a first electrode 10, a second electrode 20, and a piezoelectric layer 30.

1-1. First Electrode

The piezoelectric device 100 has the two electrodes, and the first electrode 10 is one of the two electrodes as illustrated in FIG. 1. The first electrode 10 is provided so as to face the second electrode 20. The piezoelectric layer 30 is disposed between the first electrode 10 and the second electrode 20. The first electrode 10 is in contact with the piezoelectric layer 30. The shape of the first electrode 10 is not limited in so far as the first electrode 10 is capable of facing the second electrode 20, and it may be provided in the form of a layer or a thin film. For example, the first electrode 10 is capable of being configured so as to have a thickness in the range from 50 nm to 300 nm. In addition, the shape of the first electrode 10 in a plan view is not specifically limited in so far as the piezoelectric layer 30 is capable of being disposed between the first electrode 10 and the second electrode 20 that is disposed so as to face the first electrode 10. For example, the first electrode 10 may be provided in the form of a rectangle or a circle. Furthermore, in cases where the piezoelectric device 100 is seen in a planar view, the first electrode 10 and the second electrode 20 have regions that overlap each other. One of the functions of the first electrode 10 is that it serves as one electrode (for example, a lower electrode disposed under the piezoelectric layer 30) used for applying a voltage to the piezoelectric layer 30.

With reference to FIG. 2, the first electrode 10 has a first conductive layer 12, a first intermediate layer 14, a second intermediate layer 16, and a second conductive layer 18.

1-1-1. First Conductive Layer

With reference to FIG. 2, several layers form the first electrode 10, and the first conductive layer 12 is one of such layers. The first conductive layer 12 is disposed on a side opposite to that of a layer that is provided in the first electrode 10 and that is in contact with the piezoelectric layer 30. The first conductive layer 12 is provided in the form of a layer or a thin film. For example, the first conductive layer 12 is capable of being configured so as to have a thickness in the range from 10 nm to 300 nm. In cases where the first conductive layer 12 has a thickness less than 10 nm, the first electrode 10 may not have sufficient electrical conductivity. In cases where the first conductive layer 12 has a thickness greater than 300 nm, the deformation of the piezoelectric device 100 may be restricted. One of the functions of the first conductive layer 12 is that it imparts electrical conductivity to the first electrode 10.

The first conductive layer 12 is formed with a metal or an alloy.

The metal used to form the first conductive layer 12 is a metal other than Ru (ruthenium), Rh (rhodium), Pd (palladium), Os (osmium), Ir (iridium), and Pt (platinum).

Examples of the metal to be used may include metals selected from Groups 4 to 15 of the periodic table of the elements. Specific examples of such metals include Ti (titanium), Zr (zirconium), Hf (hafnium), V (vanadium), Nb (niobium), Ta (tantalum), Cr (chromium), Mo (molybdenum), W (tungsten), Mn (manganese), Fe (iron), Co (cobalt), Ni (nickel), Cu (copper), Ag (silver), Au (gold), Zn (zinc), Cd (cadmium), Al (aluminum), In (indium), Tl (tellurium), Sn (tin), Pb (lead), and Bi (bismuth). The first conductive layer 12 is capable of being formed with any of such metals to have at least electrical conductivity, thereby imparting sufficient electrical conductivity to the first electrode 10.

In cases where the first conductive layer 12 is formed with the metal, preferable examples of the metal to be used include metals selected from Groups 4 to 11 among the above metals. Specific examples may include at least one metal selected from the group consisting of Ti, Zr, Hf, V, Nb, Ta, Cr, Mo, W, Mn, Fe, Co, Ni, Cu, Ag, and Au. In cases where the first conductive layer 12 is formed with any of such metals, the first conductive layer 12 having, for example, electrical conductivity and flexibility is capable of being provided. Accordingly, sufficient electrical conductivity is capable of being imparted to the first electrode 10, and the occurrence of cracks is suppressed in the first electrode 10 and the piezoelectric device 100, and the durability of the piezoelectric device 100 is capable of being further improved.

Instrumental analysis, such as element analysis or composition analysis, is performed on the first conductive layer 12 that is formed with the at least one metal selected from the group consisting of Ti, Zr, Hf, V, Nb, Ta, Cr, Mo, W, Mn, Fe, Co, Ni, Cu, Ag, and Au. In the results of the analysis, even if metals other than Ti, Zr, Hf, V, Nb, Ta, Cr, Mo, W, Mn, Fe, Co, Ni, Cu, Ag, and Au are detected in a trace amount, such a first conductive layer 12 is considered to be formed with the at least one metal selected from the group consisting of Ti, Zr, Hf, V, Nb, Ta, Cr, Mo, W, Mn, Fe, Co, Ni, Cu, Ag, and Au.

In cases where the first conductive layer 12 is formed with an alloy, the alloy to be used does not contain any of Ru, Rh, Pd, Os, Ir, and Pt.

An example of such an alloy includes an alloy containing any one of Ti, Zr, Hf, V, Nb, Ta, Cr, Mo, W, Mn, Fe, Co, Ni, Cu, Ag, Au, Zn, Cd, Al, In, Tl, Sn, Pb, and Bi. Such an alloy may contain two metals or may contain three or more metals. Furthermore, such an alloy may contain one or more elements including: an alkali metal such as Li (lithium), K (potassium), Na (sodium), or Rb (rubidium) selected from Group 1 of the periodic table of the elements; a metal such as Be (beryllium), Mg (magnesium), Ca (calcium), Sr (strontium), or Ba (barium), the metal being selected from Group 2 of the periodic table of the elements and including alkali earth metals; B (boron); C (carbon); N (nitrogen); Si (silicon); P (phosphorus); Ge (germanium); As (arsenic); and Sb (antimony). The first conductive layer 12 is capable of being formed with such an alloy to have at least electrical conductivity, thereby imparting sufficient electrical conductivity to the first electrode 10.

In cases where the first conductive layer 12 is formed with the above alloy, a preferable example of the alloy to be used includes an alloy containing any one of Ti, Zr, Hf, V, Nb, Ta, Cr, Mo, W, Mn, Fe, Co, Ni, Cu, Ag, and Au. Such an alloy may contain two metals or may contain three or more metals. Furthermore, such an alloy may contain one or more elements including Li, K, Na, Rb, Be, Mg, Ca, Sr, Ba, B, C, N, Si, P, Ge, As, and Sb. In cases where the first conductive layer 12 is formed with such an alloy, the first conductive layer 12 having, for example, electrical conductivity and flexibility is capable of being provided. Accordingly, sufficient electrical conductivity is capable of being imparted to the first electrode 10, and the occurrence of cracks is suppressed in the first electrode 10 and the piezoelectric device 100, and the durability of the piezoelectric device 100 is capable of being further improved.

In cases where the first conductive layer 12 is formed with the above alloy, a more preferable example of the alloy to be used includes an alloy containing at least two metals selected from the group consisting of Ti, Zr, Hf, V, Nb, Ta, Cr, Mo, W, Mn, Fe, Co, Ni, Cu, Ag, and Au. In cases where the first conductive layer 12 is formed with such an alloy, the first conductive layer 12 having, for example, further increased electrical conductivity is capable of being provided. Accordingly, further increased electrical conductivity is capable of being imparted to the first electrode 10, and the occurrence of cracks is suppressed in the first electrode 10 and the piezoelectric device 100, and the durability of the piezoelectric device 100 is capable of being further improved.

Instrumental analysis, such as element analysis or composition analysis, is performed on the first conductive layer 12 that is formed with any of above alloys. In the results of the analysis, even if elements other than those contained in the above alloys are detected in a trace amount, such a first conductive layer 12 is considered to be formed with the above alloys.

The first conductive layer 12 may have a laminate structure. For example, several layers containing the above metals may be stacked on top of one another, and several layers containing the above alloys may be stacked on top of one another, and a layer containing the above metals and a layer containing the above alloys may be regularly, alternately, or randomly stacked on top of one another. Furthermore, the number of the layers to be stacked may be appropriately determined.

Components contained in the first conductive layer 12 may disperse into at least any of the first intermediate layer 14 and an adjacent layer disposed in an opposite side of the first intermediate layer 14. Furthermore, such components may disperse along with components contained in at least any of the first intermediate layer 14 and the adjacent layer that is disposed in the opposite side of the first intermediate layer 14. In cases where the first conductive layer 12 is observed with a microscope, obvious boundaries with the first intermediate layer 14 and with the adjacent layer may not be found, the adjacent layer being disposed in the opposite side of the first intermediate layer 14. In this case, the boundaries with the first intermediate layer 14 and with the adjacent layer that is disposed in the opposite side of the first intermediate layer 14 are capable of being estimated by observation through mapping of elemental composition and through the depth profile.

1-1-2. First Intermediate Layer

With reference to FIG. 2, several layers form the first electrode 10, and the first intermediate layer 14 is one of such layers. In the first electrode 10, the first intermediate layer 14 is in contact with the first conductive layer 12 and is provided in a side of the piezoelectric layer 30 relative to the first conductive layer 12. The first intermediate layer 14 is provided in the form of a layer or a thin film. The first intermediate layer 14 is capable of being configured so as to have a thickness in the range from 30 nm to 200 nm. Although the first intermediate layer 14 has a function of blocking oxygen and moisture that are dispersed from the piezoelectric layer 30 to the first conductive layer 12, such a function may be weakened in cases where the first intermediate layer 14 has a thickness less than 30 nm. Furthermore, in cases where the first intermediate layer 14 has a thickness greater than 200 nm, the deformation of the piezoelectric device 100 may be restricted. One of the functions of the first intermediate layer 14 is that it suppresses the dispersion of oxygen and moisture from the piezoelectric layer 30 to the first conductive layer 12 in cases where the piezoelectric device 100 is at high temperature, for example during the sintering of the piezoelectric layer 30. Namely, one of the functions of the intermediate layer 14 is that it becomes a barrier that blocks the movement of oxygen and moisture. In the piezoelectric device 100, the intermediate layer 14 has such a function, thereby suppressing oxidation and corrosion of the first conductive layer 12 due to the oxygen and moisture contained in the piezoelectric layer 30. By virtue of this configuration, for example, the electrical conductivity of the first electrode 10 is capable of being maintained at a good value.

The first intermediate layer 14 contains a nitrogen compound. The nitrogen compound to be used for the first intermediate layer 14 is not specifically limited in so far as the compound is in the form of a solid at room temperature and in so far as the compound is formed into a film and then has gas blocking properties (gas barrier properties). An example of such a nitrogen compound includes a nitrogen compound containing at least one element selected from the group consisting of Ti, Al, Ta, W, Si, B, C, Ga, and In. Furthermore, such a compound may contain oxygen. An example of such a nitrogen compound may include oxynitride containing at least one element selected from the group consisting of Ti, Al, Ta, W, Si, B, C, Ga, and In.

In the above nitrogen compound, an example of the nitrogen compound preferably used for the first intermediate layer 14 includes a nitrogen compound containing at least one element selected from the group consisting of Ti, Al, Ta, W, and Si. Such a nitrogen compound is used to form the first intermediate layer 14, thereby further suppressing the oxidation and corrosion of the first conductive layer 12.

In cases where the first intermediate layer 14 has the above thickness, the nitrogen compound used for the first intermediate layer 14 is capable of exhibiting electrical conductivity, and therefore electrical conduction can be achieved between the first conductive layer 12 and the second conductive layer 18.

The first intermediate layer 14 may have a laminate structure. For example, several layers of nitrogen compounds having different compositions may be regularly, alternately, or randomly stacked. Furthermore, the number of the layers to be stacked may be appropriately determined.

Components contained in the first intermediate layer 14 may disperse into at least any of the first conductive layer 12 and the second intermediate layer 16. Furthermore, such components may disperse along with components contained in at least any of the first conductive layer 12 and the second intermediate layer 16. In cases where the first intermediate layer 14 is observed with a microscope, obvious boundaries with the first conductive layer 12 and with the second intermediate layer 16 may not be found. In this case, boundaries with the first conductive layer 12 and with the second intermediate layer 16 are capable of being estimated by observation through the mapping of elemental composition and through the depth profile.

1-1-3. Second Intermediate Layer

With reference to FIG. 2, several layers form the first electrode 10, and the second intermediate layer 16 is one of such layers. In the first electrode 10, the second intermediate layer 16 is in contact with the first intermediate layer 14 and is provided closer to the piezoelectric layer 30 than the first intermediate layer 14 is. The second intermediate layer 16 is provided in the form of a layer, a thin film, or an island. For example, the second intermediate layer 16 is capable of being configured so as to have a thickness in the range from 1 nm to 20 nm. In cases where the second intermediate layer 16 has a thickness less than 1 nm, adherence between the first intermediate layer 14 and the second conductive layer 18 may be reduced. Furthermore, in cases where the second intermediate layer 16 has a thickness greater than 20 nm, the adherence between the first intermediate layer 14 and the second conductive layer 18 may be also decreased. The second intermediate layer 16 may be configured to be thinner than the first intermediate layer 14 and second conductive layer 18. Moreover, the second intermediate layer 16 may be formed in an island shape. Even if the second intermediate layer 16 has an island shape, particular functions of the second intermediate layer 16 are capable of being provided.

One of the functions of the second intermediate layer 16 is that it provides the adherence between the first intermediate layer 14 and the second conductive layer 18. As described above, the first intermediate layer 14 contains the nitrogen compound. On the other hand, the second conductive layer 18 contains a conductive oxide, and details thereof will be described hereinafter. Accordingly, the adherence between the first intermediate layer 14 and the second conductive layer 18 may be insufficient. However, the second intermediate layer 16 is capable of improving the adherence between the first intermediate layer 14 and the second conductive layer 18. In the piezoelectric device 100, the second intermediate layer 16 has such a function, and therefore, for example, the separation of the first intermediate layer 14 from the second conductive layer 18 is suppressed, thereby reducing the breakage of the first electrode 10. By virtue of this configuration, for example, the electrical conductivity of the first electrode 10 is capable of being maintained at a good value.

The second intermediate layer 16 contains one metal selected from the group consisting of Ti, Zr, W, Ta, and Al or contains an alloy containing at least two metals selected from this group.

Instrumental analysis, such as element analysis or composition analysis, is performed on the second intermediate layer 16 containing one metal selected from the group consisting of Ti, Zr, W, Ta, and Al. In the results of the analysis, even if a metal other than the above metals is detected in a trace amount, such a second intermediate layer 16 is considered to be formed with the one metal selected from the group consisting of Ti, Zr, W, Ta, and Al.

Instrumental analysis, such as element analysis or composition analysis, is performed on the second intermediate layer 16 formed with the alloy containing at least two metals selected from the group consisting of Ti, Zr, W, Ta, and Al. In the results of the analysis, even if a metal other than the above metals is detected in a trace amount, such a second intermediate layer 16 is considered to be formed with the alloy containing at least two metals selected from the group consisting of Ti, Zr, W, Ta, and Al.

At least any of the metals and alloys that are used for the second intermediate layer 16 is capable of exhibiting electrical conductivity, and therefore electrical conduction is capable of being obtained between the first conductive layer 12 and the second conductive layer 18.

The second conductive layer 16 may have a laminate structure. For example, several layers containing the above metals may be stacked on top of one another, and several layers containing the above alloys may be stacked on top of one another, and a layer containing the above metals and a layer containing the above alloys may be regularly, alternately, or randomly stacked on top of one another. Furthermore, the number of the layers to be stacked may be appropriately determined.

Components contained in the second intermediate layer 16 may disperse into at least any of the first intermediate layer 14 and the second conductive layer 18. Furthermore, such components may disperse along with components contained in at least any of the first intermediate layer 14 and the second conductive layer 18. In cases where the second intermediate layer 16 is observed with a microscope, obvious boundaries with the first intermediate layer 14 and with the second conductive layer 18 may not be found. In this case, the boundaries with the first intermediate layer 14 and with the second conductive layer 18 are capable of being estimated by observation through the mapping of elemental composition and through the depth profile.

1-1-4. Second Conductive Layer

With reference to FIG. 2, several layers form the first electrode 10, and the second conductive layer 18 is one of such layers. In the first electrode 10, the second conductive layer 18 is provided so as to be in contact with the second intermediate layer 16 and the piezoelectric layer 30 while being interposed therebetween. The second conductive layer 18 is provided in the form of a layer or a thin film. For example, the second conductive layer 18 is capable of being configured so as to have a thickness in the range from 20 nm to 60 nm. In cases where the second conductive layer 18 has a thickness less than 20 nm, electrical conductivity of the first electrode 10 may come to be insufficient, and crystalline properties and crystal orientation in a material of the piezoelectric layer 30 may not satisfy predetermined conditions. Furthermore, in cases where the second conductive layer 18 has a thickness greater than 60 nm, the deformation of the piezoelectric layer 100 may be restricted.

One of the functions of the second conductive layer 18 is that it plays a partial role for electrical conductivity of the first electrode 10. Another function of the second conductive layer 18 is that it provides the material of the piezoelectric layer 30 with predetermined crystalline properties and a crystal orientation.

The second conductive layer 18 contains a conductive oxide. Preferably, a conductive compound to be used for the second conductive layer 18 is a conductive oxide having a Perovskite crystal structure. An example of such a conductive oxide includes an oxide having a chemical composition represented by a general formula $M_A M_B O_3$ (in the general formula, an atom of an element corresponding to a site $M_A$ is coordinated to 12 oxygen atoms, and an atom of an element corresponding to a site $M_B$ is coordinated to six oxygen atoms).

On the basis of the general formula $M_A M_B O_3$, a specific example of such a conductive oxide includes a conductive oxide containing at least one element selected from the group consisting of La (lanthanum), Sr, Ca, Ba, Pb, Na, and Bi as the element corresponding to the site $M_A$ and containing at least one element selected from the group consisting of Ni, Ru, Ti, Zr, In, Sn, and Hf as the element corresponding to the site $M_B$.

A preferable example of the conductive oxide to be used for the second conductive layer 18 includes an oxide containing at least one element selected from the group consisting of La, Sr, Ca, In, Ni, Ru, and Sn among the above elements. Examples of such a conductive oxide include $LaNiO_3$, $SrRuO_3$, and $CaRuO_3$.

The conductive oxide contained in the second conductive layer 18 has an excellent self orientation. Especially, the conductive oxides of the preferred example have particularly excellent self orientations. Namely, in cases where the conductive oxides have crystal structures in a process in which the conductive oxides are formed into a film as the second conductive layer 18, the conductive oxides have a tendency to be spontaneously oriented in a <100> crystal orientation in a direction normal to a film surface. Such orientation is referred to as the self orientation herein.

Namely, the piezoelectric layer 30 is formed so as to be in contact with the second conductive layer 18, and the material of the piezoelectric layer 30 inherits the crystal orientation of the second conductive layer 18 in cases where materials of the piezoelectric layer 30 are crystallized. For example, a certain axial direction in the crystal of the material of the piezoelectric layer 30 is likely to be oriented in a direction normal to the piezoelectric layer 30. In the piezoelectric device 100 of the embodiment, each of the second conductive layer 18 and the piezoelectric layer 30 is formed with the material that can have the Perovskite crystal structure, and crystal is likely to be oriented in the <100> crystal orientation in a direction normal to each of the layers. The axial direction of the crystal having such an orientation is capable of employing, for example, a <110> crystal orientation or a <111> crystal orientation other than the <100> crystal orientation by appropriately selecting the materials of the second conductive layer 18 and the piezoelectric layer 30. Furthermore, such an orientation of the crystal axis is capable of being appropriately selected depending on application of the piezoelectric device 100. Namely, a mode and direction of the deformation of the piezoelectric device 100 are capable of being selected by combining the orientation of the crystal of the piezoelectric layer 30 with a direction of an electric voltage applied through the first electrode 10 and the second electrode 20. Furthermore, as in the case of use of the piezoelectric device 100 as a capacitor of a ferroelectric memory, the orientation is appropriately adjusted so as to enhance performance of the device depending on the application of the device.

The second conductive layer 18 may have a laminate structure. For example, several layers containing the conductive oxides having different compositions may be regularly, alternately, or randomly stacked. Furthermore, the number of the layers to be stacked may be appropriately determined.

Components contained in the second conductive layer 18 may disperse into at least any of the second intermediate layer 16 and the piezoelectric layer 30. Furthermore, such components may disperse along with components contained in at least any of the second intermediate layer 16 and the piezoelectric layer 30. In cases where the second conductive layer 18 is observed with a microscope, obvious boundaries with the second intermediate layer 16 and with the piezoelectric layer 30 may not be found. In this case, the boundaries with the second intermediate layer 16 and with the piezoelectric layer 30 are capable of being estimated by observation through the mapping of elemental composition and through the depth profile.

1-2. Second Electrode

With reference to FIG. 1, the second electrode 20 is disposed so as to face the first electrode 10. The second electrode 20 may entirely face the first electrode 10 or may partially face the first electrode 10. The shape of the second electrode 20 is not limited in so far as the second electrode 20 is capable of facing the first electrode 10. However, in cases where the piezoelectric device 100 is provided in the form of a thin film, the second electrode 20 is preferably provided in the form of a layer or a thin film. In this case, the second electrode 20 is capable of being configured so as to have a thickness in the range from 50 nm to 300 nm. The planar shape of the second electrode 20 is not specifically limited in so far as the second electrode 20 is provided so as to face the first electrode 10 with the result that the piezoelectric layer 30 is capable of being disposed therebetween. For example, the second electrode 20 is capable of being provided in the form of a rectangle or a circle.

One of the functions of the second electrode 20 is that it serves as one electrode (for example, an upper electrode formed on the piezoelectric layer 30) used for applying a voltage to the piezoelectric layer 30.

Examples of a material of the second electrode 20 include various metals such as Ni, Ir, and Pt; a conductive oxide thereof (for example, iridium oxide); a composite oxide of Sr and Ru ($SrRuO_x$:SRO); and a composite oxide of La and Ni ($LaNiO_x$:LNO). The second electrode 20 may have a single layer structure of the above materials or may have a structure in which the several materials are stacked.

The second electrode 20 may have a configuration the same as that of the first electrode 10 and may be produced with the material the same as that of the first electrode 10. Namely, in sequence beginning with a side of the piezoelectric layer 30, the second electrode 20 may be configured so as to include the first conductive layer 18 that is in contact with the piezoelectric layer 30, the second intermediate layer 16 that is in contact with the second conductive layer 18, the first intermediate layer 14 that is in contact with the second intermediate layer 16, and the first conductive layer 12 that is in contact with the first intermediate layer 14. In this case, the first conductive layer 12, the first intermediate layer 14, the second intermediate layer 16, and the second conductive layer 18 have the configurations the same as those described above, and therefore the description are omitted.

In the example illustrated in FIG. 1, although a planar region of the first electrode 10 is configured to be larger than that of the second electrode 20, a planar region of the second electrode 20 may be configured to be larger than that of the first electrode 10. In this case, the second electrode 20 may be formed on a side surface of the piezoelectric layer 30, and the second electrode 20 can have an additional function to shield the piezoelectric layer 30 from the moisture and hydrogen. In addition, in cases where any one of the first electrode 10 and the second electrode 20 is configured to be larger than the other electrode, the larger electrode may serve as a common electrode of several piezoelectric devices.

1-3. Piezoelectric Layer

With reference to FIG. 1, the piezoelectric layer 30 is disposed between the first electrode 10 and the second electrode 20. The piezoelectric layer 30 is provided so as to be in contact with at least the first electrode 10. Another layer may be formed between the piezoelectric layer 30 and the second electrode 20. In this case, an example of such a layer includes a titanium layer.

In the examples illustrated in the drawings, the piezoelectric layer 30 is provided so as to be in contact with the second conductive layer 18 of the first electrode 10 and in contact with the second electrode 20. For example, the piezoelectric layer 30 is capable of being configured so as to have a thickness in the range from 100 nm to 2000 nm. In cases where the piezoelectric layer 30 has a thickness out of such a range, sufficient deformation (electromechanical transduction) may not be achieved. Preferably, the piezoelectric layer 30 has a thickness in the range from 1000 nm to 1500 nm. In cases where the piezoelectric layer 30 has a thickness in such a range, the piezoelectric device 100 is capable of being configured so as to be deformed in a sufficiently large amount, and such a configuration contributes to the thinning of the device.

A material of the piezoelectric layer 30 is not specifically limited in so far as the material has piezoelectric properties. An example of such a material includes an oxide represented by a general formula $M_C M_D O_3$ (for example, an element corresponding to the site $M_C$ includes at least one metal selected from the group consisting of Pb, K, Ba, Sr, and Bi, and an element corresponding to the site $M_D$ includes at least one metal selected from the group consisting of Zr, Ti, Nb, Na, Ta, and La).

In such an oxide, a preferable example of the material of the piezoelectric layer 30 includes a composite oxide containing at least Pb, Zr, Ti, and O. More specifically, preferable examples of the composite oxide for the material of the piezoelectric layer 30 include lead zirconate titanate [$Pb(Zr,Ti)O_3$] (hereinafter referred to as PZT in short, where appropriate) and lead zirconate titanate niobate[$Pb(Zr,Ti,Nb)O_3$] (hereinafter referred to as PZTN in short, where appropriate).

In each of such composite oxides, a solid solution containing an oxide of the element corresponding to the site $M_C$ and containing an oxide of the element corresponding to the site $M_D$ is capable of being formed. Such composite oxides are capable of being crystallized to have the Perovskite crystal structure. The composite oxides are capable of being crystallized to have the Perovskite crystal structure, thereby exhibiting the piezoelectric properties. Accordingly, the piezoelectric layer 30 is capable of being deformed by applying a voltage through the first electrode 10 and the second electrode 20 (namely, electromechanical transduction). The deformation of the piezoelectric layer 30 enables the piezoelectric device 100 to be deformed. Accordingly, in cases where an actuator is configured using the piezoelectric device 100 for example, a movable section of the actuator is capable of being deformed (bent) and vibrating.

Furthermore, the piezoelectric layer 30 is provided so as to be in contact with the second conductive layer 18 of the first electrode 10. Accordingly, in cases where the material of the piezoelectric layer 30 is crystallized, the crystallization is capable of being subjected to the influence of the crystal orientation of the second conductive layer 18. In addition, in cases where the material of the piezoelectric layer 30 is crystallized, the crystalline properties, such as the size and quality of a crystal grain, in the second conductive layer 18 are capable of being inherited. Accordingly, the crystal orientation and crystalline properties of the material of the piezoelectric layer 30 are enhanced.

For example, in the crystallization of the material of the piezoelectric layer 30, in cases where the crystal of the second conductive layer 18 is oriented in the <100> crystal orientation in a direction normal to the layer, an axial direction in the crystal of the piezoelectric layer 30 is likely to be oriented in the <100> crystal orientation. Furthermore, such an orientation of a crystal axis is capable of being appropriately selected depending on application of the piezoelectric device 100. Namely, a mode and direction of the deformation of the piezoelectric device 100 are capable of being selected by combining the orientation of the crystal of the piezoelectric layer 30 with a direction of an electric voltage applied through the first electrode 10 and the second electrode 20. Furthermore, as in the case of use of the piezoelectric device 100 as the capacitor of the ferroelectric memory, the orientation is appropriately adjusted so as to enhance performance of a device depending on the application of the device.

The piezoelectric layer 30 may have a laminate structure. For example, several layers including piezoelectric layers having different compositions or including piezoelectric layers having the same compositions may be stacked. Furthermore, the piezoelectric layer 30 may have the gradient of composition in a thickness direction. Moreover, the number of the layers to be stacked is appropriately determined.

Components contained in the piezoelectric layer 30 may disperse into at least any of the second conductive layer 18 of the first electrode 10 and the second electrode 20. Furthermore, such components may disperse along with components contained in at least any of the second conductive layer 18 of the first electrode 10 and the second electrode 20. In cases where the piezoelectric layer 30 is observed with a microscope, obvious boundaries with the second conductive layer 18 of the first electrode 10 and with the second electrode 20 may not be found. In this case, the boundaries with the second conductive layer 18 of the first electrode 10 and with the second electrode 20 are capable of being estimated by observation through the mapping of elemental composition and through the depth profile.

1-4. Piezoelectric Actuator

Figure 3:
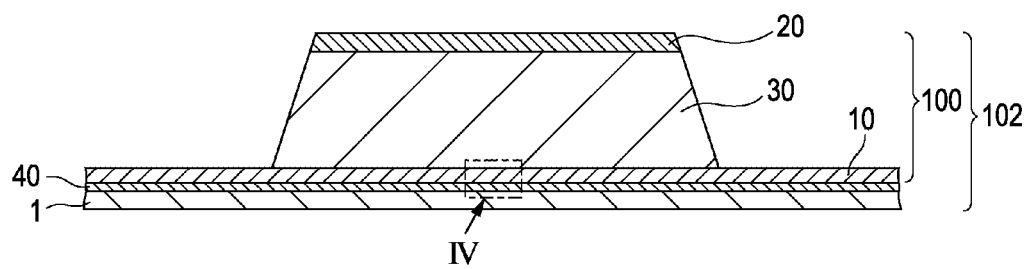
FIG. 3 is a cross-sectional view schematically illustrating a piezoelectric actuator according to the embodiment.
Figure 4:
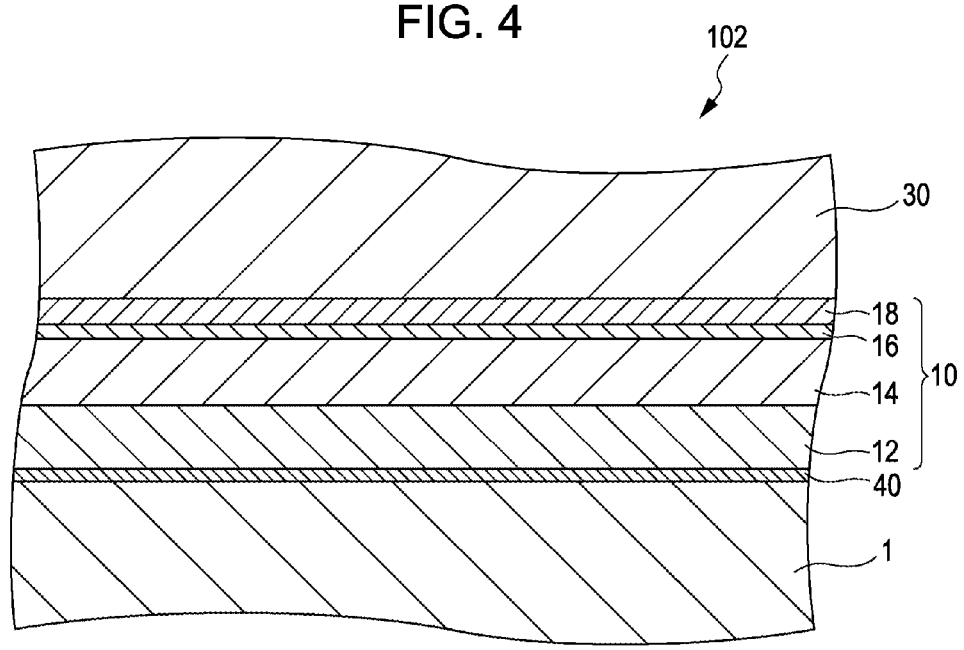
FIG. 4 is a cross-sectional view schematically illustrating part of the piezoelectric actuator according to the embodiment in an enlarged manner.

A piezoelectric actuator including the piezoelectric device 100 of the embodiment will be described. FIG. 3 is a cross-sectional view schematically illustrating a piezoelectric actuator 102 as an example of the piezoelectric actuator according to the embodiment. FIG. 4 is a cross-sectional view schematically illustrating part of the piezoelectric actuator 102 in an enlarged manner.

The piezoelectric actuator 102 includes the piezoelectric device 100, a third intermediate layer 40, and a substrate 1.

With reference to FIG. 4, the third intermediate layer 40 is provided so as to be in contact with the first conductive layer 12 of the first electrode 10 of the piezoelectric device 100. The third intermediate layer 40 is provided in the form of a layer, a thin film, or an island. The third intermediate layer 40 is capable of being configured so as to have a thickness, for example, in the range from 1 nm to 40 nm. In cases where the third intermediate layer 40 has a thickness less than 1 nm, adherence between the first conductive layer 12 and the substrate 1 may be reduced. Furthermore, also in cases where the third intermediate layer 40 has a thickness greater than 40 nm, the adherence between the first conductive layer 12 and the substrate 1 may be decreased. The third intermediate layer 40 may be configured to be thinner than the first intermediate layer 12 and substrate 1. In addition, even if the third intermediate layer 40 is formed in an island shape, specific functions of the third intermediate layer 40 are capable of being provided.

One of functions of the third intermediate layer 40 is that it helps the first conductive layer 12 of the first electrode 10 to be closely attached to the substrate 1. Increased adherence between the first conductive layer 12 and the substrate 1 enables the deformation of the piezoelectric device 100 to be efficiently transmitted to the substrate 1. By virtue of this configuration, for example, the operating characteristics, such as the deformation, of the piezoelectric actuator 102 are capable of being improved. The first conductive layer 12, which is in contact with the third intermediate layer 40, contains the metal and the alloy as described above, and on the other hand, the substrate 1, which is in contact with the intermediate layer 40, contains an oxide, a nitride, or a metal (details thereof will be hereinafter described). Accordingly, the adherence between the first conductive layer 12 and the substrate 1 may not be sufficient. In this case, the third intermediate layer 40 is capable of enhancing the adherence therebetween. In the piezoelectric actuator 102, the third intermediate layer 40 has such a function, and therefore, for example, the separation of the first conductive layer 12 from the substrate 1 is suppressed, thereby reducing the breakage of the piezoelectric actuator 102. Consequently, the piezoelectric actuator 102 having high reliability and durability is capable of being produced.

Examples of a material of the third intermediate layer 40 include one metal selected from the group consisting of Ti, Zr, Al, W, Si, and Ta; an alloy containing at least two metals selected from such a group; or a nitride or oxide containing at least one metal selected from such a group. Specific examples of the material of the third intermediate layer 40 include Ti, Zr, TiAl, WSi, Ta, TaN, AlN, WN, $TiO_x$, and $ZrO_x$.

Instrumental analysis, such as element analysis or composition analysis, is performed on the third intermediate layer 40 that is formed with the above materials. In the results of the analysis, in cases where elements other than Ti, Zr, Al, W, Si, and Ta are detected in a trace amount, such a third intermediate layer 40 is considered to be formed with: the one metal selected from the group consisting of Ti, Zr, Al, W, Si, and Ta; the alloy of at least two metals selected from such a group; or the nitride or oxide containing at least one metal selected from such a group.

The third intermediate layer 40 may have a laminate structure. For example, several layers including a layer containing the above metals, a layer containing the above alloys, a layer containing the above oxides, and a layer containing the above nitrides may be stacked. Furthermore, such several layers may be regularly, alternately, or randomly stacked. Moreover, the number of the layers to be stacked may be appropriately determined.

Components contained in the third intermediate layer 40 may disperse into at least any of the first conductive layer 12 and the substrate 1. Furthermore, such components may disperse along with components contained in at least any of the first conductive layer 12 and the substrate 1. In cases where the third intermediate layer 40 is observed with a microscope, obvious boundaries with the first conductive layer 12 and with the substrate 1 may not be found. In this case, the boundaries with the first conductive layer 12 and with the substrate 1 are capable of being estimated by observation through the mapping of elemental composition and through the depth profile.

For example, the substrate 1 may be formed with an electric conductor, a semiconductor, and an insulator in the form of a flat plate. The substrate 1 may have a single layer structure or may have a structure in which several layers are stacked. The inner configuration of the substrate 1 is not limited in so far as the upper surface of the substrate 1 has a planar shape. For example, the substrate 1 may have a configuration in which a space or the like is provided therein. Furthermore, for example, if a pressure chamber or the like is provided under the substrate 1 as in the case of a liquid ejecting head that will be described hereinafter (see, FIGS. 6 and 7), several configurations provided under the substrate 1 may be integrally regarded as one substrate 1.

The substrate 1 may be a vibrating plate (insulating layer) that has flexibility and that is capable of being deformed (bent) in response to the operation of the piezoelectric layer 30 (piezoelectric device 100). In this case, the piezoelectric actuator 102 having the vibrating plate and the piezoelectric device 100 is provided. The substrate 1 has the flexibility, and it herein means that the substrate 1 is capable of bending. In cases where the piezoelectric actuator 102 having the substrate 1 as the vibrating plate is used for the liquid ejecting head, the bend of the substrate 1 is sufficient if a volume inside a pressure chamber is capable of being changed in an amount the same as a variation in a volume of a liquid to be ejected.

In cases where the substrate 1 is the vibrating plate, examples of a material of the substrate 1 includes an inorganic oxide such as a zirconium dioxide ($ZrO_2$) and a silicon dioxide ($SiO_2$), an inorganic nitride such as a silicon nitride ($Si_3N_4$), and an alloy such as stainless steel. Among these, the zirconium dioxide is especially preferable as the material of the substrate 1 (vibrating plate) in terms of chemical stability and rigidity. In this case, the substrate 1 may have a laminate structure containing two or more of the above materials.

In the embodiment, the piezoelectric actuator 102 having the substrate 1 has been described, the substrate 1 being provide as the vibrating plate that is formed with the zirconium dioxide. Such a piezoelectric actuator 102 has the piezoelectric device 100, and therefore electrical conductivity and flexibility of the first electrode 10 are provided, thereby providing at least excellent durability.

In the piezoelectric device 100 of the piezoelectric actuator 102, in cases where the second electrode 20 is configured so as to have a configuration the same as that of the first electrode 10, the first conductive layer 12 is exposed on a surface of the second electrode 20 on a side opposite to that of the piezoelectric layer 30. In this case, for example, a protective film is capable of being provided on the second electrode 20 on the side opposite to that of the piezoelectric layer 30, namely on the first conductive layer 12 on the side opposite to that of the piezoelectric layer 30. Examples of the protective film may include a layer of a nitrogen compound and a layer of a polymer compound.

The piezoelectric actuator in which the substrate 1 deforms in a manner such as the bend has been described as an example of a piezoelectric actuator according to an aspect of the invention. However, the piezoelectric actuator according to an aspect of the invention is capable of being applied to other piezoelectric devices, for example, including: a timing device in which the substrate 1 is provided as a tuning-fork shaped vibration piece; an ultrasonic device such as an ultrasonic oscillator in which the substrate 1 vibrates by a frequency in an ultrasonic range to generate ultrasonic waves; a device having a mechanical output, such as an ultrasonic motor in which the substrate 1 vibrates by the frequency in the ultrasonic range to actuate other members; and a pressure sensor in which the piezoelectric device 100 detects stress applied to the substrate 1 and detects the deformation of the substrate 1.

2. Manufacturing Method of Piezoelectric Device

An example of a manufacturing method of the piezoelectric device according to an aspect of the invention will be described hereinafter. Although an example in which a piezoelectric actuator is manufactured will be described in the following description, the piezoelectric device is manufactured in a process in which the piezoelectric actuator is manufactured.

First, the substrate 1 is prepared, and the first electrode 10 is formed on the substrate 1. The first conductive layer 12, the first intermediate layer 14, and the second intermediate layer 16 are capable of being formed by, for example, a sputtering technique, a plating technique, and a vacuum deposition method. The second conductive layer 18 is capable of being formed by, for example, the sputtering technique, a chemical vapor deposition (CVD) method, a sol-gel process, a laser ablation method, and a metal organic deposition (MOD) method. The first electrode 10 is capable of being appropriately patterned.

Subsequently, the piezoelectric layer 30 is formed on the first electrode 10. For example, the piezoelectric layer 30 is capable of being formed by the sol-gel process, the CVD method, the MOD method, the spattering method, and the laser ablation method. In cases where the material of the piezoelectric layer 30 is the PZT, the piezoelectric layer 30 is sintered at a temperature in the range from 650° C. to 750° C. in an oxygen atmosphere, thereby being crystallized. The piezoelectric layer 30 may be crystallized after the patterning.

The piezoelectric layer 30 may be formed by repeating the above process at least two times. By virtue of such a formation process, crystalline properties and crystal quality are capable of being enhanced in the piezoelectric layer 30 as a whole. The piezoelectric layer 30 is formed so as to be in contact with the first electrode 10.

Subsequently, the second electrode 20 is formed on the piezoelectric layer 30. For example, the second electrode 20 is capable of being formed by the spattering technique, the plating technique, and the vapor deposition method. The second electrode 20 and the piezoelectric layer 30 are patterned in predetermined shapes, thereby producing the piezoelectric device. The second electrode 20 and the piezoelectric layer 30 are capable of being simultaneously patterned, where appropriate. With the above processes, the piezoelectric actuator (piezoelectric device) according to an aspect of the invention is capable of being manufactured.

3. Example and Reference Example

An example and a reference example will be described hereinafter to more specifically describe some aspects of the invention. Meanwhile, embodiments of the invention are not limited to the following example and reference example at all.
3-1. Manufacturing of Laminate Structure Laminate structures of the example and reference example were manufactured as describe below.

In the laminate structure of the example, a silicon substrate was prepared, and the third intermediate layer 40 containing Ti was formed on the substrate by the spattering technique so as to have a thickness of 10 nm. Subsequently, a film containing W was formed as the first conductive layer 12 of the first electrode 10 by the spattering technique so as to have a thickness of 100 nm. Subsequently, a film containing TiAlN was formed as the first intermediate layer 14 by the spattering technique so as to have a thickness of 100 nm. Subsequently, a film containing Ti was formed as the second intermediate layer 16 so as to have a thickness of 15 nm. Subsequently, a film containing $LaNiO_3$ was formed as the second conductive layer 18 by the CVD method so as to have a thickness of 40 nm. With these processes, the first electrode 10 was formed. The piezoelectric layer 30 containing the PZT was formed on the first electrode 10 so as to have a thickness of 130 nm.

A slurry containing the PZT was applied onto the first electrode 10 by a spin coat method. In the spin coating, edge rinse was performed using a main solvent, and a spin rate was set to be 1500 rpm. The applied slurry was dried at a temperature of 100° C. for five minutes in the air and then was dried at a temperature of 150° C. for five minutes in the air, thereby removing a solvent. Subsequently, the resultant product was heated at a temperature of 400° C. for five minutes in the air, thereby removing an organic component in the slurry (degreasing). Subsequently, the resultant product was sintered at a temperature of 700° C. for five minutes in an oxygen atmosphere with the result that a piezoelectric layer containing the PZT and having a thickness of 130 nm was produced.

A slurry used in the sol-gel process was a mixed solution of lead acetate ($C_4H_6O_4Pb$), zirconium tetra-ethoxide [$Zr(OC_2H_5)_4$], and titanium tetra-ethoxide [$Ti(OC_2H_5)_4$], and n-butanol was used as a solvent. The slurry had a composition ratio of Pb:Zr:Ti=108:52:48, which was a ratio of the number of atoms in the elements contained in the slurry.

In the laminate structure of the reference example, a silicon substrate was prepared, and the third intermediate layer 40 containing $TiO_2$ was formed on the substrate by the spattering technique so as to have a thickness of 100 nm. Subsequently, a film containing W was formed as the first conductive layer 12 of the first electrode 10 by the spattering technique so as to have a thickness of 100 nm. Subsequently, a film containing $LaNiO_2$ was formed as the second conductive layer 18 by the CVD method so as to have a thickness of 40 nm without forming layers corresponding to the first intermediate layer 14 and the second intermediate layer 16. With these processes, the first electrode 10 was formed. The piezoelectric layer 30 containing the PZT was formed on the first electrode 10 so as to have a thickness of 130 nm as in the case of the above example.

3-2. Result of Observation of Surfaces of Laminate Structures

Figure 5A:
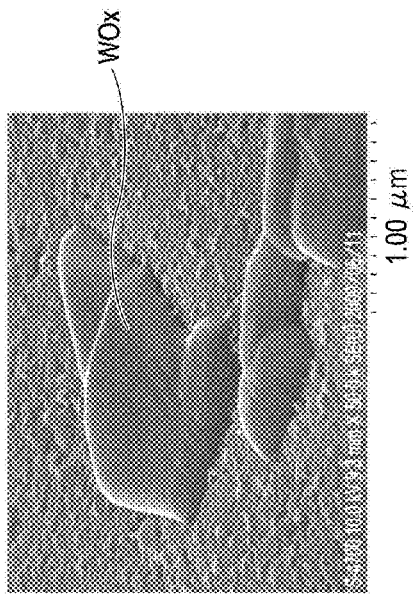
FIG. 5A illustrates a scanning electron microscope (SEM) image of a surface of a laminate structure in an example.
Figure 5C:
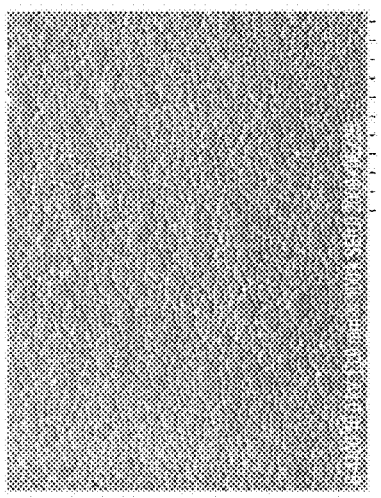
FIG. 5C illustrates a SEM image of a surface of the laminate structure in the reference example.
Figure 5B:
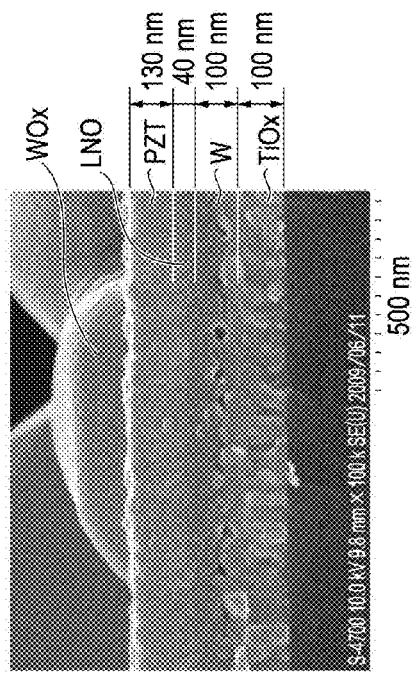
FIG. 5B illustrates a SEM image of a cross-sectional surface of the laminate structure in the example.
Figure 5D:
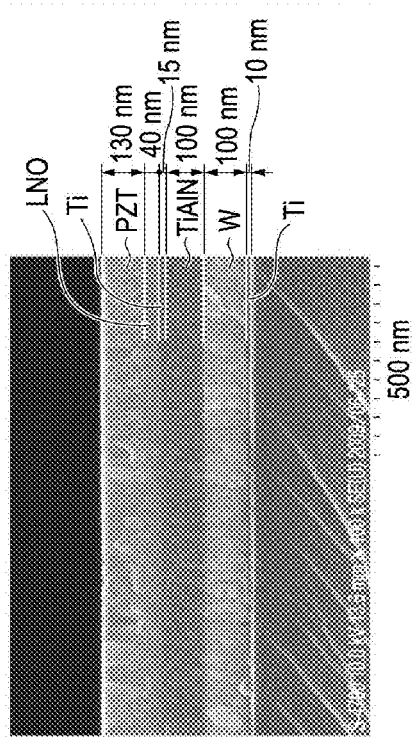
FIG. 5D illustrates a SEM image of a cross-sectional surface of the laminate structure in the reference example.

FIGS. 5A to 5D illustrate scanning electron microscope (SEM) images of surfaces and cross-sectional surfaces of the laminate structures in the example and reference example. More specifically, FIG. 5A illustrates a surface (upper surface of the piezoelectric layer 30) of the laminate structure in the example, and FIG. 5B illustrates a cross-sectional surface of the laminate structure in the example. Furthermore, FIG. 5C illustrates a surface (upper surface of the piezoelectric layer 30) of the laminate structure in the reference example, and FIG. 5D illustrates a cross-sectional surface of the laminate structure in the reference example.

With reference to FIGS. 5A and 5B, the surface of the piezoelectric layer 30 of the laminate structure in the example is observed to find crystal grains of the PZT, and significantly excellent surface conditions are evaluated. Furthermore, in the observation of the cross-sectional surface of the laminate structure in the example, each layer is clearly confirmed, and voids and defects are not found. On the other hand, with reference to FIGS. 5C and 5D, foreign substances are found on a surface of the piezoelectric layer 30 of the laminate structure in the reference example. The foreign substances were analyzed by an energy dispersive X-ray analysis (EDX) to find that the foreign substances were oxides of tungsten (W). Furthermore, in the observation of the cross-sectional surface of the laminate structure in the reference example, boundaries between the layers are extremely unclear, and voids and defects are found especially in a layer of W.

On the basis of the observational results, the following presumption is generated. Namely, the laminate structure in the reference example did not have a layer corresponding to the first intermediate layer 14. Therefore, in the sintering of the laminate structure, oxygen and moisture were easily dispersed from a side of the PZT into the tungsten layer, thereby oxidizing and corroding tungsten. Accordingly, it is thought that a volume of tungsten was expanded and that the tungsten therefore passed crystal grain boundaries, resulting in the emergence and deposition of the tungsten on the surface of the PZT layer. The voids were considered to be generated in the tungsten layer through this process. On the other hand, in the laminate structure in the example, the deposition as in the reference example was not found on the surface of the piezoelectric layer 30 (PZT layer). Accordingly, in the laminate structure in the example, although oxygen and moisture may be dispersed from a side of the piezoelectric layer 30 (PZT layer) into a side of the first conductive layer 12 during the sintering, it is thought that the first intermediate layer 14 (the layer of nitrogen compound) blocked such dispersion. Consequently, it is thought that the oxidization and corrosion of the tungsten were suppressed in the laminate structure in the example, thereby producing an excellent laminate structure.

4. Liquid Ejecting Head

Figure 6:
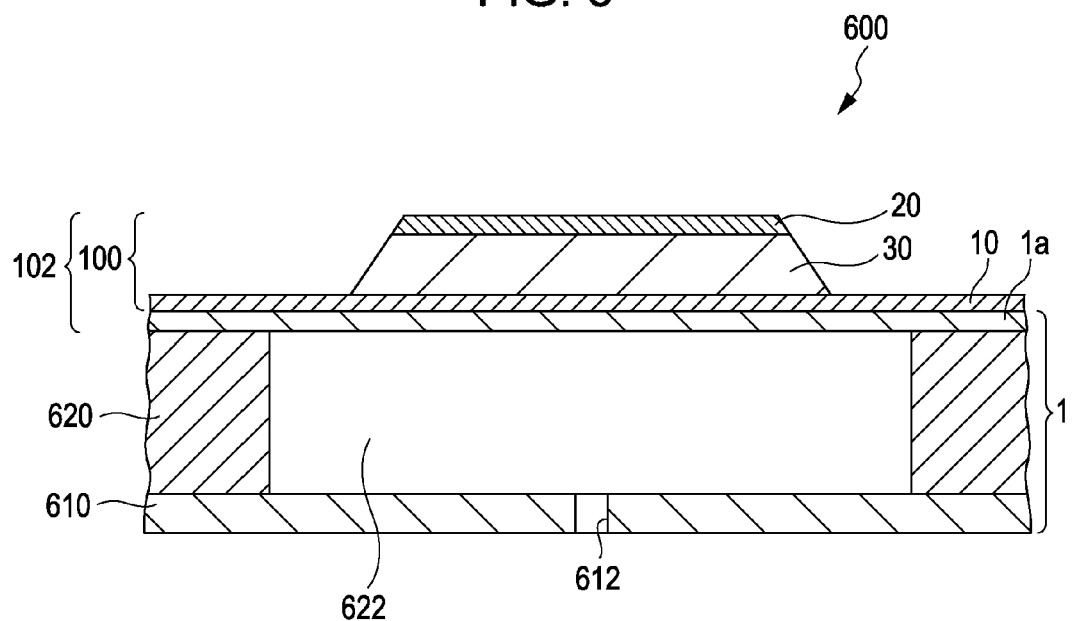
FIG. 6 is a cross sectional view schematically illustrating part of a liquid ejecting head according to the embodiment.
Figure 7:
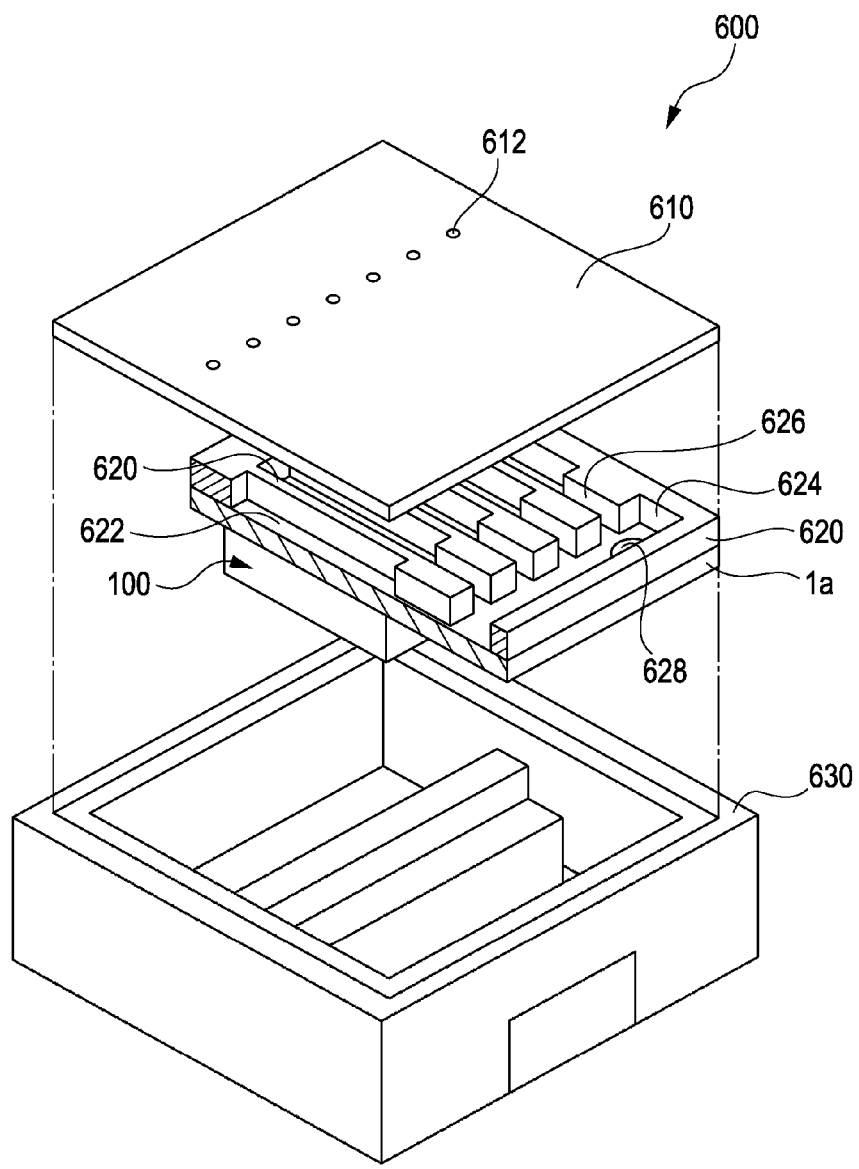
FIG. 7 is an exploded perspective view schematically illustrating the liquid ejecting head according to the embodiment.

A liquid ejecting head 600 in which the piezoelectric device according to an aspect of the invention functions as a piezoelectric actuator will be described with reference to the accompanying drawings. FIG. 6 is a cross-sectional view schematically illustrating part of the liquid ejecting head 600. FIG. 7 is an exploded perspective view schematically illustrating the liquid ejecting head 600, and the liquid ejecting head 600 is illustrated upside down relative to a normal use situation.

The liquid ejecting head 600 is capable of including the above piezoelectric device (piezoelectric actuator). In the following example, the liquid ejecting head 600 will be described, in which the piezoelectric device 100 is formed on the substrate 1 (a structure in which a vibrating plate 1a is provided at the upper portion of the substrate 1) and in which the piezoelectric device 100 and the vibrating plate 1a form the piezoelectric actuator 102.

With reference to FIGS. 6 and 7, the liquid ejecting head 600 includes a nozzle plate 610 having a nozzle hole 612, a pressure chamber substrate 620 that serves to form a pressure chamber 622, and the piezoelectric device 100. Furthermore, the liquid ejecting head 600 may have a housing 630 as illustrated in FIG. 7. FIG. 7 illustrates simplified piezoelectric device 100.

With reference to FIGS. 6 and 7, the nozzle plate 610 has the nozzle hole 612. The nozzle hole 612 is capable of ejecting ink. For example, a plurality of the nozzle holes 612 are formed on the nozzle plate 610 in line. Examples of a material of the nozzle plate 610 include silicon and steel used stainless (SUS).

The pressure chamber substrate 620 is disposed on the nozzle plate 610 (under the nozzle plate 610, in FIG. 7). An Example of a material of the pressure chamber substrate 620 includes silicon. The pressure chamber substrate 620 defines a space between the nozzle plate 610 and the vibrating plate 1a, and therefore the liquid ejecting head 600 is provided with a reservoir (liquid reserving section) 624, a feed opening 626 connected to the reservoir 624, and the pressure chamber 622 connected to the feed opening 626 as illustrated in FIG. 7. The reservoir 624, the feed opening 626, and the pressure chamber 622 are flow channels of the liquid. Although the flow channels are individually described in this embodiment, they may be designed in any manner. In addition, for example, although part of the flow channels is narrowed to form the feed opening 626 in the illustration, such a configuration is not indispensable. The feed opening 626 may be formed on the basis of an appropriate design. The reservoir 624, the feed opening 626, and the pressure chamber 622 are defined by the nozzle plate 610, the pressure chamber substrate 620, and the vibrating plate 1a. The reservoir 624 is capable of temporarily reserving ink supplied from the outside section (an ink cartridge, for example) through a thorough-hole 628 formed on the vibrating plate 1a. The ink inside the reservoir 624 is capable of being supplied to the pressure chamber 622 through the feed opening 626. The vibrating plate 1a is deformed, and therefore volume of the pressure chamber 622 is changed. The pressure chamber 622 is connected to the nozzle hole 612. The volume change in the pressure chamber 622 enables the ink or the like to be ejected from the nozzle hole 612.

The piezoelectric device 100 is disposed on the pressure chamber substrate 620 (under the pressure chamber substrate 620, in FIG. 7). The piezoelectric device 100 is capable of being electrically connected to a driving circuit (not illustrated) for the piezoelectric device and is worked (vibrated and deformed) on the basis of a signal transmitted from the driving circuit. The vibrating plate 1a is deformed depending on the action of the laminate structure (piezoelectric layer 30) and therefore is capable of appropriately changing inner pressure of the pressure chamber 622.

With reference to FIG. 7, the housing 630 is capable of accommodating the nozzle plate 610, the pressure chamber substrate 620, and the piezoelectric device 100. Examples of a material of the housing 630 include a resin and metal.

The liquid ejecting head 600 includes the above piezoelectric device 100 having at least the above excellent durability. Accordingly, the liquid ejecting head 600 also has high durability.

In this embodiment, the liquid ejecting head 600 as an ink jet recording head has been described. However, the liquid ejecting head according to an aspect of the invention may be applied to, for example, a color material ejecting head used for manufacturing a color filter of a liquid crystal display or the like, an electrode material ejecting head used for forming an electrode of an organic electro-luminescence (EL) display and a field emission display (FED), a living-organic material ejecting head used for manufacturing a biochip.

5. Liquid Ejecting Apparatus

Figure 8:
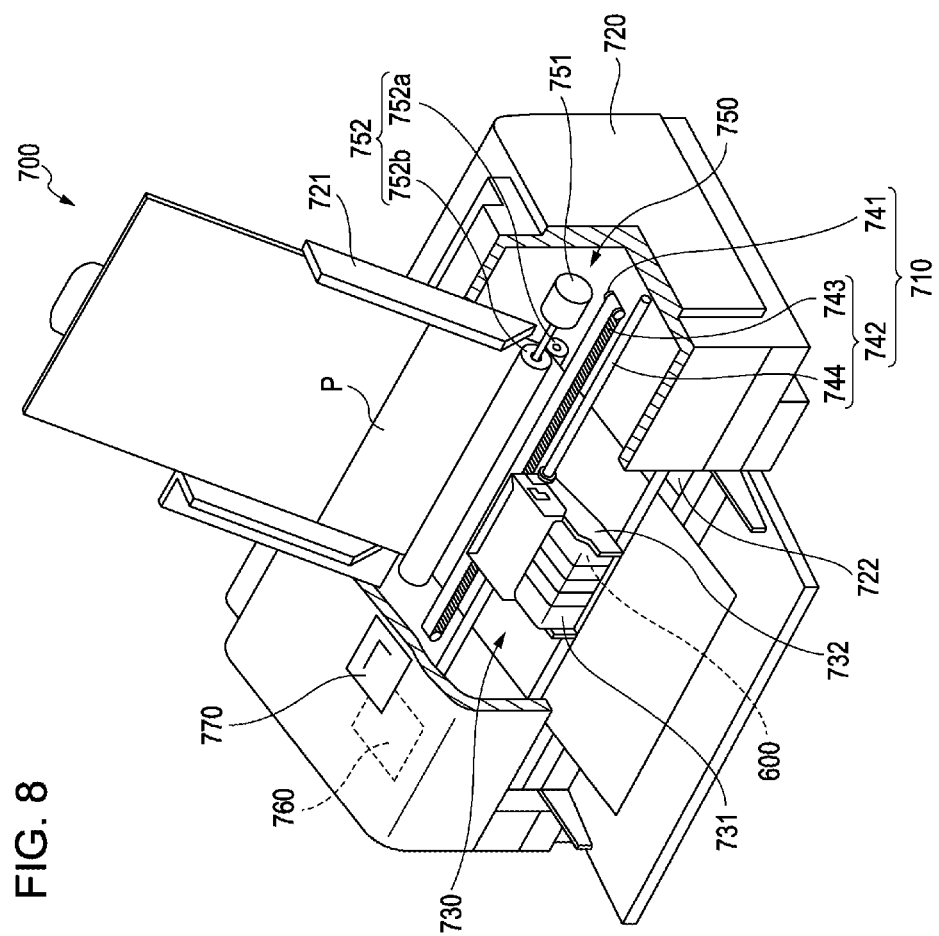
FIG. 8 is a perspective view schematically illustrating a liquid ejecting apparatus according to the embodiment.

A liquid ejecting apparatus according to the embodiment will be described with reference to the accompanying drawing. The liquid ejecting apparatus has the above liquid ejecting head. The liquid ejecting apparatus as an ink jet printer having the above liquid ejecting head will be described hereinafter. FIG. 8 is a perspective view schematically illustrating a liquid ejecting apparatus 700 according to the embodiment.

With reference to FIG. 8, the liquid ejecting apparatus 700 includes a head unit 730, a driving section 710, and a control section 760. Furthermore, the liquid ejecting apparatus 700 is capable of including an apparatus body 720, a paper feed section 750, a paper feed tray 721 on which recording paper P is placed, an ejection opening 722 through which the recording paper P is ejected, and an operation panel 770 disposed on an upper surface of the apparatus body 720.

The head unit 730 has an ink jet recording head (hereinafter referred to as "head", simply) including the liquid ejecting head 600. Furthermore, the head unit 730 has an ink cartridge 731 which supplies ink to the head and has a transporting unit (carriage) 732 on which the head and the ink cartridge 731 are mounted.

The driving section 710 enables the head unit 730 to be reciprocated. The driving section 710 has a carriage motor 741 that is a driving source of the head unit 730 and has a reciprocating mechanism 742 that reciprocates the head unit 730 by receiving the rotation of the carriage motor 741.

The reciprocating mechanism 742 includes a carriage guide shaft 744 of which two ends are supported by a frame (not illustrated) and includes a timing belt 743 extending in parallel with the carriage guide shaft 744. The carriage 732 is supported by the carriage guide shaft 744 so as to be able to be reciprocated. Furthermore, the carriage 732 is fixed to part of the timing belt 743. The carriage motor 741 is operated to work the timing belt 743, and therefore the head unit 730 is reciprocated while being guided by the carriage guide shaft 744. During the reciprocation, ink is appropriately ejected from the head to perform printing to the recording paper P.

In the embodiment, although printing is performed while the liquid ejecting head 600 and the recording paper P are moved, the liquid ejecting apparatus according to an aspect of the invention may have a configuration in which printing is performed to the recording paper P while the liquid ejecting head 600 and the recording paper P relatively change positions each other. Furthermore, in the embodiment, although printing is performed to the recording paper P, a recording medium to which printing is capable of being performed by the liquid ejecting apparatus according to an aspect of the invention is not limited to paper. Examples of such a medium variously include cloth, a film, and a metal, and the configuration of the apparatus may be appropriately changed.

The control section 760 is capable of controlling the head unit 730, the driving section 710, and the paper feed section 750.

The paper feed section 750 is capable of transporting the recording paper P from the paper feed tray 721 toward the head unit 730. The paper feed section 750 includes a paper feed motor 751 that is a driving source thereof and includes a paper feed roller 752 that rotates by the operation of the paper feed motor 751. The paper feed roller 752 includes a driven roller 752a and a driving roller 752b, and the driving roller 752b is disposed above the driven roller 752a so as to face each other while a transport path of the recording paper P is interposed therebetween. The driving roller 752b is connected to the paper feed motor 751. The control section 760 drives the paper feed section 750, and then the recording paper P is transported so as to pass below the head unit 730.

The head unit 730, the driving section 710, the control section 760, and the paper feed section 750 are provided inside the apparatus body 720.

The liquid ejecting apparatus 700 includes the liquid ejecting head 600 having high durability. Accordingly, the liquid ejecting apparatus 700 has high reliability.

The above exemplified liquid ejecting apparatus has a single liquid ejecting head, and printing is capable of being performed to a recording medium by the liquid ejecting head, but the apparatus may include a plurality of the liquid ejecting heads. In cases where the liquid ejecting apparatus includes the plurality of the liquid ejecting heads, the liquid ejecting heads may be individually operated in the above manner, or the liquid ejecting heads may be connected to each other to form an integrated head. An Example of such an integrated head include a line-type head in which each nozzle hole of the heads is overall positioned so as to be spaced at a uniform distance.

Although the ink jet recording apparatus 700 as an ink jet printer has been described as an example of the liquid ejecting apparatus according to an aspect of the invention, the liquid ejecting apparatus according to an aspect of the invention may be also applied to industrial use. In this case, various functional materials that are prepared with a solvent or a dispersion medium so as to have appropriate viscosity may be used as a liquid (liquid material) to be ejected. The liquid ejecting apparatus according to an aspect of the invention is capable of being preferably applied not only to the exemplified image recording apparatus such as a printer, but also to a color material ejecting apparatus used for manufacturing a color filter of a liquid crystal display or the like; a liquid material ejecting apparatus used for forming an electrode and color filter of an organic EL display, a FED, and an electrophoretic display; and a living-organic material ejecting apparatus used for manufacturing a biochip.

The above embodiments and various modifications are merely examples, and embodiments of the invention are not limited to the above embodiments. For example, a plurality of the embodiments and modifications are capable of being appropriately combined.

Embodiments of the invention are not limited to the above embodiments and are capable of being variously modified. For example, embodiments of the invention include configurations substantially the same as those described in the above embodiments (for example, configurations having the same functions, processes, and results or having the same objects and advantageous effects as those in the above embodiments). In addition, embodiments of the invention may include configurations provided by changing non-essential parts of the configurations described in the above embodiments. Furthermore, embodiments of the invention may include configurations that are capable of providing the same effects as those described in the above embodiments or that are capable of providing the same advantages as those in the above embodiments. Still furthermore, embodiments of the invention may include configurations in which at least one well-known technique is added to the configurations described in the above embodiments.

What is claimed is:

1. A piezoelectric device comprising:
a first electrode;
a second electrode provided so as to face the first electrode; and
a piezoelectric layer disposed between the first electrode and the second electrode, wherein:
the first electrode includes a first conductive layer, a first intermediate layer provided so as to be in contact with the first conductive layer, a second intermediate layer provided so as to be in contact with the first intermediate layer, and a second conductive layer provided so as to be in contact with the second intermediate layer and the piezoelectric layer,
the first conductive layer contains at least one metal and/or an alloy, the one metal being selected from the group consisting of Ti, Zr, Hf, V, Nb, Ta, Cr, Mo, W, Mn, Fe, Co, Ni, Cu, Ag, and Au, and the alloy containing at least one metal selected from the group;
the first intermediate layer contains a nitrogen compound;
wherein the first intermediate layer deters movement of oxygen and moisture into the first conductive layer;
the second intermediate layer contains at least one metal and an alloy, the one metal being selected from the group consisting of Ti, Zr, W, Ta, and Al, and the alloy containing at least two metals selected from the group;
wherein the second intermediate layer promotes adherence between the first intermediate layer and the second conductive layer; and
the second conductive layer contains a conductive oxide.

2. The piezoelectric device according to claim 1, wherein the first intermediate layer contains a nitrogen compound containing at least one metal selected from the group consisting of Ti, Al, Ta, W, and Si.

3. The piezoelectric device according to claim 1, wherein the second conductive layer contains a conductive oxide containing at least one metal selected from the group consisting of La, Sr, Ca, In, Ni, Ru, and Sn.

4. The piezoelectric device according to claim 1, wherein the first conductive layer contains at least one metal and/or an alloy, the one metal being selected from the group consisting of Ti, Zr, Hf, V, Nb, Ta, Cr, Mo, W, Mn, Fe, Co, Ni, Cu, Ag, and Au, and the alloy containing at least two metals selected from the group.

5. The piezoelectric device according to claim 1, wherein the piezoelectric layer has a thickness in the range from 100 nm to 2000 nm.

6. The piezoelectric device according to claim 1, wherein the first electrode conductive layer has a thickness in the range from 50 nm to 300 nm.

7. The piezoelectric device according to claim 1, wherein the first conductive layer has a thickness in the range from 10 nm to 300 nm.

8. The piezoelectric device according to claim 1, wherein the first intermediate layer has a thickness in the range from 30 nm to 200 nm.

9. The piezoelectric device according to claim 1, wherein the second intermediate layer has a thickness in the range from 1 nm to 20 nm.

10. The piezoelectric device according to claim 1, wherein the second conductive layer has a thickness in the range from 20 nm to 60 nm.

11. The piezoelectric device according to claim 1, wherein the second electrode layer has a thickness in the range from 50 nm to 300 nm.

* * * * *